United States Patent
Takahashi et al.

(10) Patent No.: US 7,030,258 B2
(45) Date of Patent: Apr. 18, 2006

(54) WATER-CAPTURING AGENT AND ORGANIC EL DEVICE

(75) Inventors: Hisamitsu Takahashi, Mobara (JP); Shigeru Hieda, Mobara (JP); Yoshihisa Tsuruoka, Mobara (JP); Satoshi Tanaka, Mobara (JP)

(73) Assignee: Futaba Corporation, Chiba-ken (JP)

( * ) Notice: Subject to any disclaimer, the term of this patent is extended or adjusted under 35 U.S.C. 154(b) by 0 days.

(21) Appl. No.: 10/868,019

(22) Filed: Jun. 15, 2004

(65) Prior Publication Data

US 2004/0256592 A1    Dec. 23, 2004

(30) Foreign Application Priority Data

Jun. 17, 2003    (JP) .............................. 2003-172034

(51) Int. Cl.
   *C07F 5/06*    (2006.01)
   *B23B 9/00*    (2006.01)
   *H01L 29/24*   (2006.01)

(52) U.S. Cl. ...................... 556/175; 556/179; 428/690; 313/504; 313/512; 257/100; 252/180

(58) Field of Classification Search ................ 556/175, 556/179; 252/180; 313/504, 512; 257/100; 428/690
See application file for complete search history.

(56) References Cited

U.S. PATENT DOCUMENTS 6,656,609 B1    12/2003    Takahashi et al.
6,790,381 B1    9/2004    Tsuruoka et al.

FOREIGN PATENT DOCUMENTS

JP    09-148066       6/1997
JP    2002-033187    1/2002

OTHER PUBLICATIONS

Patent Abstracts Of Japan, Abstract for Japanese Patent Laid-Open Publication No. 09-148066.
Patent Abstracts Of Japan, Abstract for Japanese Patent Laid-Open Publication No. 2002-033187.

*Primary Examiner*—Porfirio Nazario-Gonzalez
(74) *Attorney, Agent, or Firm*—Quarles & Brady LLP

(57) ABSTRACT

A water-capturing agent capable of inhibiting the generation and growth of a darkspot and an organic EL device including the water-capturing agent are provided. The organic EL device uses the water-capturing agent comprising a compound illustrated by the chemical structural formula (1);

Formula (1)

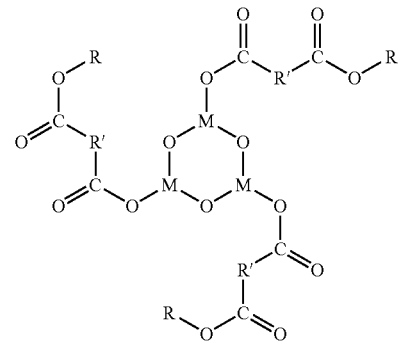

wherein R and R' are independently a substituent selected from the group consisting of an alkyl group, aryl group, cycloalkyl group, alkoxy group, acyl group and heterocyclic group having an unsaturated bond and one or more of a hydrogen atom and a carbon atom, or a substituent formed by substituting at least one of a hydrogen atom of said group with a halogen atom, and a central atom M is a metal having coordination number of six.

14 Claims, 2 Drawing Sheets

WATER-CAPTURING AGENT AND ORGANIC EL DEVICE

CROSS REFERENCES TO RELATED APPLICATIONS

Not Applicable.

STATEMENT REGARDING FEDERALLY SPONSORED RESEARCH

Not Applicable.

BACKGROUND OF THE INVENTION

1. Field of the Invention

The present invention generally relates to an organic EL device, and more particularly to a water-capturing agent for inhibiting the generation and growth of a darkspot of a non-light emitting portion.

2. Description of the Prior Art

Generally, an organic EL device (organic electroluminescent device) has a light-emitting structure of laminate comprising an organic EL device sandwiched between an anode and a cathode which is a thin film containing a luminescent organic compound. A hole and an electron are injected into the thin film containing a luminescent organic compound and are re-combined to generate an exciton. When the exciton is deactivated, it emits light (fluorescence, phosphorescence). An organic EL device is a natural light device taking advantage of such fluorescence or phosphorescence.

One of the most significant problems of the organic EL device is an improvement in the lifetime of a light-emitting portion. The cause of a short lifetime is the generation of a non-light emitting dot known as a "darkspot". The non-light emitting dot grows with the elapsed time of lighting and a non-light emitting area enlarges gradually and luminance decreases gradually. When the diameter of the non-light emitting portion grows up to tens of μm, it is confirmed visually. That is to say, when the diameter of the non-light emitting portion grows up to tens of μm, the lifetime of EL device nearly runs out. The main cause of the generation of the darkspot is that an organic EL layer constituting the organic EL device reacts with moisture or oxygen in a sealed container and the darkspot generates and grows partially.

It is, therefore, necessary to reduce to the utmost the moisture in a sealed container in which is placed an organic EL device. It is particularly important to refine an organic material used for a light emitting portion in a state that no moisture exists in the organic material. Further, several methods have been proposed in order to reduce to the utmost the moisture in a sealed container. For example, when the inside of a vacuum chamber used for forming an electroluminescent layer on a substrate is manufactured, or when a sealing cap is put over a light emitting portion formed on a substrate, an effort has been made to reduce to the utmost the moisture in the sealed container. That is to say, the manufacture of an EL organic device has been carried out in a dry process. However, the moisture can not be completely removed from such conventional manufacturing processes and hence the generation and growth of darkspots can not be completely inhibited.

As described above, the most important problem to be solved for an organic EL device is to eradicate the darkspot by removing the moisture completely in a sealed container or to attempt to prolong the lifetime of the device by stopping the growth of small darkspots. In a commercially available organic EL device, the afore-mentioned problem has been solved by placing an inorganic drying agent as a drying means in a container and sealing it. Such a technique is relevant to the present invention and is publicly known as described in Unexamined Patent Publications No. 2002-267138.

Further, a conventional organic drying means involves a powder which is a disadvantage. In order to solve such a disadvantage, a technique has been proposed for forming effectively a water-capturing means capable of inhibiting the generation and growth of the darkspot in the peripheral portion of an organic EL device. Such a water-capturing means has a water-capturing layer of film made of an organometallic compound having high reactivity with moisture, effectively captures the moisture, and does not contain oxygen. Such a technique is described in Unexamined Patent Publications No. 2002-33187.

FIG. 2 is a partly diagrammatic sectional view showing a sealing structure of an organic EL device. As shown in FIG. 2, an organic EL device has a structure in which the anode electrode 55 and cathode electrode 56 are placed opposite each other on the glass substrate 52 made of glass etc., and the organic light-emitting layer 54 of the organic EL device 51 is sandwiched between the anode electrode 55 and cathode electrode 56. A recess 59 formed in the sealing cap 53 is filled with powder of barium oxide (BaO) as the water-capturing agent 57. The cap is fixed with the water-permeable tape 60, such that the powder does not scatter into a tube. The sealed tube is filled with dried nitrogen air, and is fixed to the substrate 52 with the adhesive 58 of epoxy resin in order to prevent the moisture from invading from the outside.

As shown in FIG. 3, the organic EL device 71 has a structure in which the anode electrode 75 and cathode electrode 76 are placed opposite each other on the glass substrate 52, and the organic light-emitting layer 74 of the organic EL device 71 is sandwiched between the anode electrode 75 and cathode electrode 76. The organic light-emitting layer 74 has a three-layered structure comprising the hole-injecting layer 74a, the hole-transporting layer 74b and the light-emitting layer-and- electron-transporting layer 74c. The organic light-emitting layer 74 is placed in a sealed container comprising the glass substrate 72, the sealing cap 73 and the sealing portion 78. The water-capturing agent layer 77 is place in the sealed container in order to prevent the organic EL light-emitting layer 74 of the organic EL material from being contaminated with the moisture. The water-capturing agent layer 77 is composed of a thin film of an organometallic complex compound having the chemical structural formula (2), (3) or (4) illustrated below:

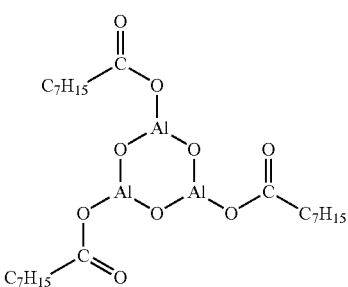

Formula (2)

-continued

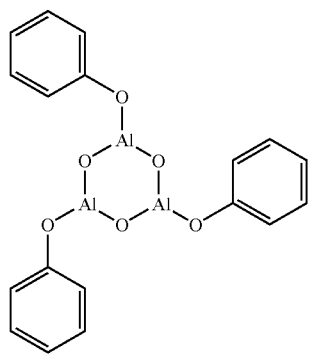

Formula (3)

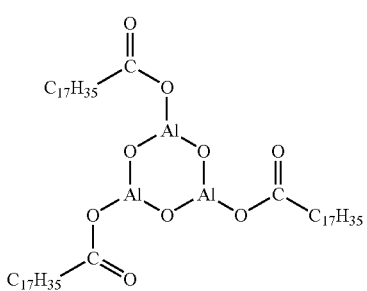

Formula (4)

The organometallic complex compound having the chemical structural formula (2), (3) or (4) is soluble in an organic solvent and liquid at the time of mounting. Such an organometallic complex compound is applied to the entire surface of the inside of the sealing cap 73 of a flat glass plate which has been subjected to a spot facing processing by means of a processing machine, such as a sandblaster etc., and the water-capturing agent layer 77 having a thickness of 10 μm is formed. The water-capturing agent layer 77 of this type requires neither tape 60 nor a recess formed in the sealing cap 73, which is different from the case where powder-type water-capturing agent is used. Accordingly, the entire thickness of the organic EL device can be made thinner.

However, a conventional water-capturing agent BaO (barium oxide) has several disadvantages as described below:

The handling of the conventional water-capturing agent BaO (barium oxide) involves problems in a work environment or market, because it is a deleterious substance. Since barium oxide is powder, it scatters while it is charged into a sealed container. That is to say, it is not easy to handle. Since the water-capturing agent is powder, it is necessary to place independently a space for sealing the water-capturing agent. Accordingly, there has been a problem making the entire thickness of the device thinner.

In the case of a conventional film-shaped water-capturing agent, it is necessary to remove solvents by heating in a process for forming the film. Accordingly, there has been a problem that a long time is required to form the film.

A drying system used for the film-shaped water-capturing agent requires an apparatus of large size. Hence, there has been a problem that the space for installing such an apparatus in a manufacturing place is large which decreases operation efficiency.

SUMMARY OF THE INVENTION

The present invention has been made in order to solve such problems as above described. An object of the present invention is to provide a water-capturing agent which inhibits the generation and growth of a darkspot and can be easily dried in a drying process by a photopolymerization process and provide an organic EL device having such a water-capturing agent as a drying means.

According to the present invention, there is provided a water-capturing agent formed of a compound illustrated by the chemical structural formula (1).

Formula (1)

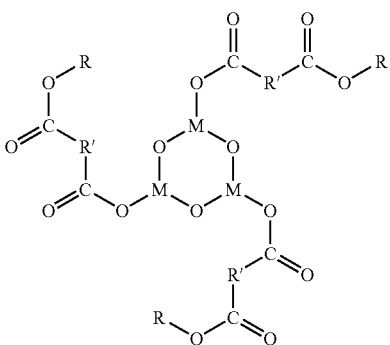

wherein R and R' are independently a substituent selected from the group consisting of an alkyl group, aryl group, cycloalkyl group, alkoxy group, acyl group and heterocyclic group having an unsaturated bond and one or more of a hydrogen atom and a carbon atom, or a substituent formed by substituting at least one of a hydrogen atom of said group with a halogen atom, and a central atom M is a metal having coordination number of six.

In another aspect of the present invention, there is provided an organic EL device comprising an organic EL light-emitting portion having a hole-injecting layer, a hole-transporting layer and a light-emitting layer formed of an organic compound laminated between a pair of electrodes at least one of which is transparent, a sealed container for sealing the organic EL light-emitting portion, and a water-capturing agent placed in the sealed container, wherein said water-capturing agent is represented by the chemical structural formula (1).

Formula (1)

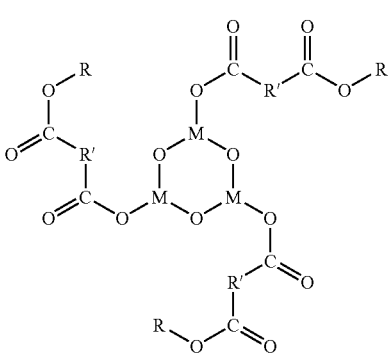

wherein R and R' are independently a substituent selected from the group consisting of an alkyl group, aryl group, cycloalkyl group, alkoxy group, acyl group and heterocyclic group having an unsaturated bond and one or more of a hydrogen atom and a carbon atom, or a substituent formed by substituting at least one of a hydrogen atom of said group with a halogen atom, and a central atom M is a metal having coordination number of six.

According to the present invention, the substituent R of the compound illustrated by the chemical structural formula (1) may be two or more different groups. It may be two different groups or three different groups. Optionally, the compound is used in combination with another compound. The water-capturing agent may contain a photosensitizer for permitting the water-capturing agent to dry under a drying process with ultraviolet-light irradiation or a thermopolymerizable material for permitting the water-capturing agent to dry under a drying process by heating.

BRIEF DESCRIPTION OF THE DRAWINGS

A more complete understanding of the present invention may be had with reference to the following detailed explanations which are given in connection with the accompanying drawings, in which.

DETAILED DESCRIPTION OF THE PREFERRED EMBODIMENT

Figure 1:
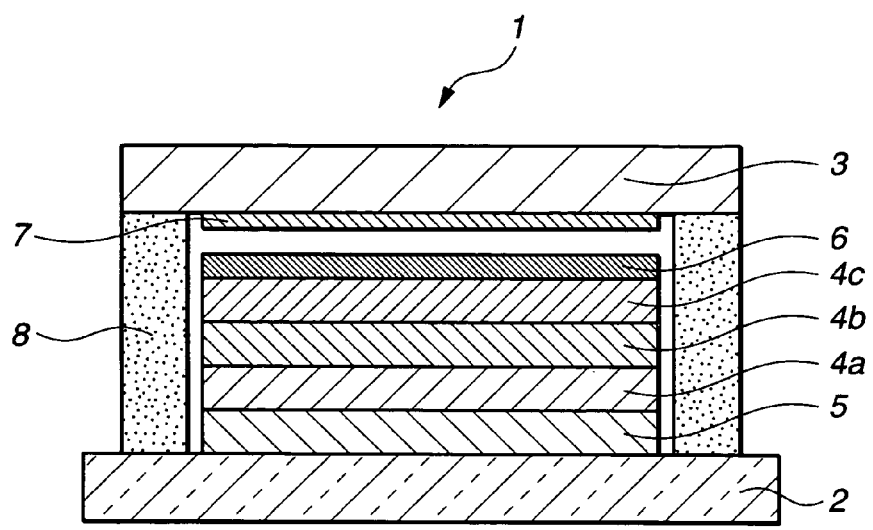
FIG. 1 is a side sectional view of an organic EL device showing a working embodiment of the present invention.
Figure 2:
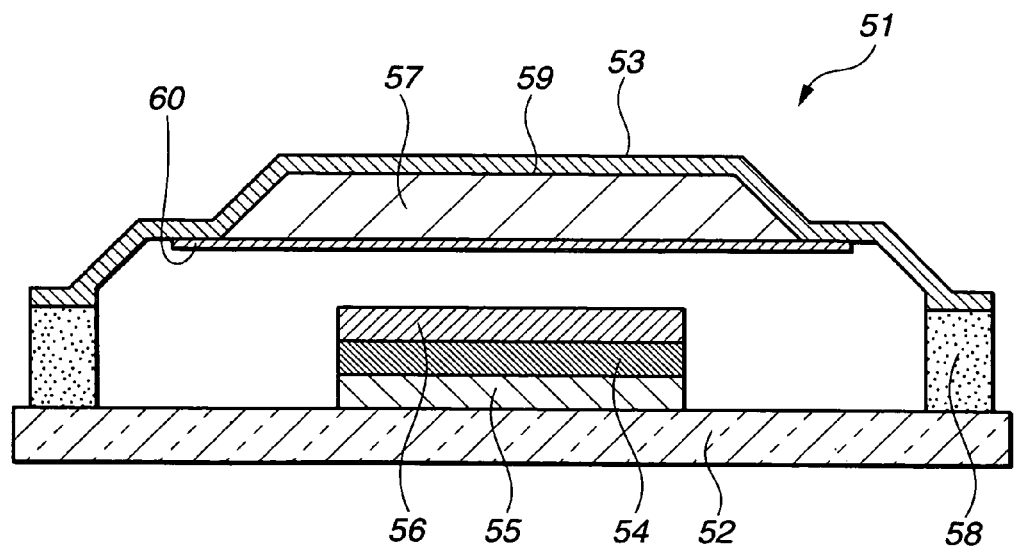
FIG. 2 is a side sectional view of an organic EL device of a prior art.
Figure 3:
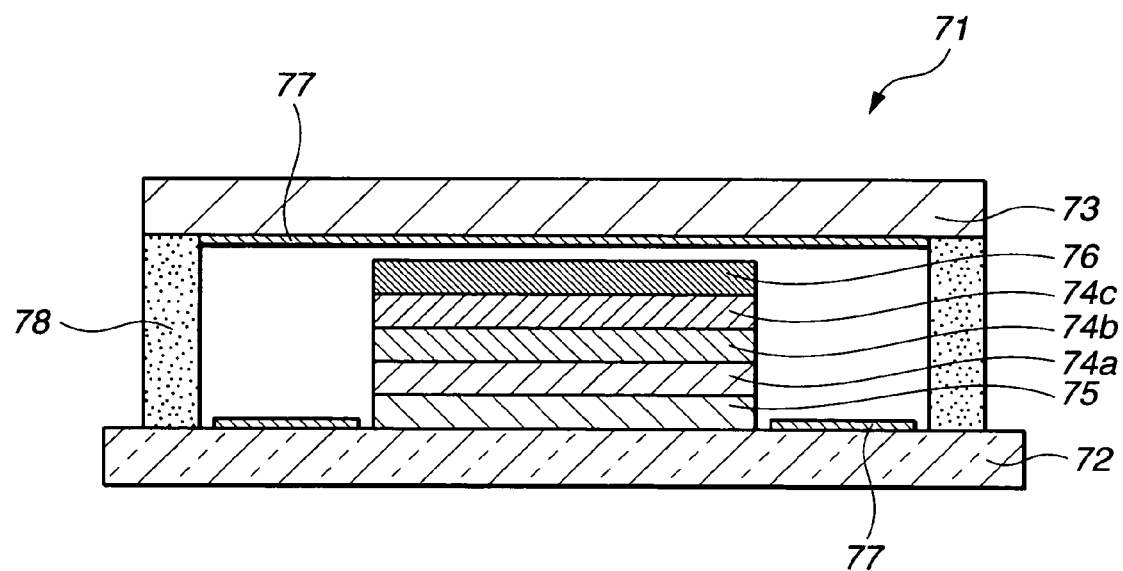
FIG. 3 is a side sectional view of an organic EL device of another prior art.

As shown in FIG. 1, the organic EL device 1 comprises a rectangle-shaped glass plate having the insulating properties and light transmission properties as a glass substrate 2. The anode 5 is formed in a given pattern with a conductive material having transparency on the surface of the inside of the glass substrate 2. The conductive material having transparency, for example ITO film, is formed on the entire surface of the glass substrate 2 by a PVD (Physical Vapor Deposition) process, such as vapor deposition process, sputtering process, and so forth. Thereafter, the anode 5 is formed in a pattern having a desired shape by means of photolithography process. A part of the anode 5 is pulled to the end of the glass substrate 2 as a lead electrode and connected to a driven circuit not shown in the FIGS.

On the upper surface of the anode 5, the organic EL layer 4 comprising a thin film of an organic compound is laminated by means of a PVD process, such as molecular beam deposition process, resistive heating process, and so forth. The organic El layer 4 of an example shown in FIG. 1 has a three-layered structure comprising the hole-injecting layer 4a of copper phthalocyanine (CuPc) formed on the anode 5 in tens of μm in film thickness, the hole-transporting layer 4b of Bis((N-(1-maphtyl-n-phenyl))benzidine($\alpha$-NPD) formed on the hole-injecting layer 4a in tens of μm of film thickness, and the light-emitting layer-and-electron-transporting layer 4c of tris(8-quinolinolat) aluminum ($Alq_3$) formed on the hole-transporting layer 4b in tens of μm of film thickness. The light-emitting portion is formed by a laminate having a five-layered structure comprising the anode 5, the organic EL layer 4 and the cathode 6 described later.

As shown in FIG. 1, the cathode 6 is formed as a metallic thin film on the upper surface of the organic EL layer 4, that is, the light-emitting layer-and-electron-transporting layer 4c of $Alq_3$. The material of the metallic thin film is a simple substance of metallic material having a small work function, such as Al, Li, Mg, In, and so forth, or an alloy having a small work function, such as Al—Li, Mg—Ag, and so forth.

The film thickness of the cathode 6 is, for example in the range from tens of μm to hundreds of μm, preferably in the range from 50 μm to 200 μm. A part of the cathode is pulled to the end of the glass substrate 2 as a lead electrode and connected to a driven circuit (not shown).

On the other hand, the sealing cap 3 of a rectangle-shaped glass plate is placed opposite the glass substrate 2. To the outer peripheral portion of the sealing cap 3 a sealing portion of, for example, an ultraviolet light-curable adhesive is formed in a sealing process described later. The water-capturing agent layer 7 is placed in the inner surface of the sealing cap 3 other than the sealing portion.

For the water-capturing agent of the organometallic complex compound of the present invention, a solvent available in coating is not restricted only to a hydrocarbon-type organic solvent. Therefore, when it is applied by means of a screen printing process, it is dissolved in an organic solvent, such as butylcarbitol, terpineol, and so forth. A cellulose polymer, such as ethyl cellulose, hydroxypropyl cellulose, and so forth, can be used as a binder. Polymethacrylate or polyacrylate can be used as a polymer.

A film-forming method other than a screen printing method is exemplified by a spinner method, spray method, dispenser method, inkjet method, doctor blade method, offset method, and so forth.

A drying means is exemplified by an oven, vacuum oven, hot plate, far infiared rays, belt furnace, and so forth. These drying steps are usually carried out in an atmosphere of dried nitrogen.

In a sealing process, the outer peripheral portion of a rectangle-shaped sealing cap 3 is coated with an adhesive, such as ultraviolet-light curable resin, as the sealing material 8 and the glass substrate 2 is sealed and fixed with the sealing cap 3 in an atmosphere of inert gas from which the moisture is removed to the utmost or in a dried atmosphere by dried air. The anode 5, the organic EL layer 4 and the cathode 5 are protected by the sealing cap 3.

Next, an explanation is given below on the water-capturing action of the organometallic complex compound illustrated by the chemical structural formula (1) according to the present invention which has been discovered by the inventors of the present invention.

The organometallic complex compound illustrated by the chemical structural formula (1) according to the present invention captures the moisture by substitution reaction or addition reaction. That is to say, the water molecules of the moisture in an organic EL container react with the organometallic complex compound to form a hydroxide. Consequently, water-capture is performed. The inventors of the present invention recognized for the first time that the organometallic complex compound illustrated by the chemical structural formula (1) has such a water-capturing action and it shows sufficient effect as a water-capturing agent for an organic EL device. Since the transparent film of such an organometallic complex compound and the reduction of tact time in the manufacturing process is required, the inventors of the present invention studied in more detail these organometallic complex compounds. As a result, the inventors of the present invention found that a novel organometallic complex compound can be produced by introducing a double bond into the substituent of a conventional water-capturing agent. Moreover, such a novel organometallic complex compound can form a transparent film that has the water-capturing capability equivalent, or superior, to that of a conventional water-capturing agent, and can realize the reduction of the tact time by photopolymerizing, or thermopolymerizing, such a novel organometallic complex compound.

A substituent R of the organometallic complex compound illustrated by the chemical structural formula (1) is exemplified below. However, the substituent R of the organometallic complex compound illustrated by the chemical structural formula (1) is not restricted thereto.

In the chemical structural formula (1), R and R' are independently a substituent selected from the group consisting of an alkyl group, aryl group, cycloalkyl group, alkoxy group, acyl group and heterocyclic group having an unsaturated bond and one or more of a hydrogen atom and carbon atom, or a substituent formed by substituting at least one of a hydrogen atom of said group with a halogen atom, and a central atom M is a metal having a coordination number of six.

In the chemical structural formula (1), R is an alkyl group, alkenyl group, aryl group, cycloalkyl group, heterocyclic group or acyl group having at least one carbon atom. An alkyl group may be substituted or non-substituted. Examples of an alkyl group are a methyl group, ethyl group, propyl group, butyl group, sec-butyl group, tert-butyl group, pentyl group, hexyl group, heptyl group, octyl group, nonyl group, decyl group, undecyl group, dodecyl group, tridecyl group, tetradecyl group, pentadecyl group, hexadecyl group, heptadecyl group, octadecyl group, nonadecyl group, eicosyl group, heneicosyl group, docosyl group and so forth. However, an alkyl group having eight carbon atoms and above is preferable. For a substituted or non-substituted alkyl group examples described below are preferable. A polymer or oligomer thereof may be used. Examples of an alkenyl group are a vinyl group, allyl group, butenyl group, pentenyl group, hexenyl group and so forth. However, an alkenyl group having eight carbon atoms and above is preferable. For a substituted or non-substituted alkenyl group examples described below are preferable. A polymer or oligomer thereof may be used.

An aryl group may be substituted or non-substituted. Examples of an aryl group are a phenyl, tolyl group, 4-cyanophenyl group, biphenyl group, o, m, p-terphenyl group, naphthyl group, anthranyl group, phenanthrenyl group, fluorenyl group, 9-phenylanthranyl group, 9,10-diphenylanthranyl group, pyrenyl group, and so forth. However, an aryl group having carbon atoms of eight and above is preferable. For a substituted or non-substituted aryl group examples described below are preferable. A polymer or oligomer thereof may be used.

Examples of a substituted or non-substituted alkoxy group are a methoxy group, n-butoxy group, tert-butoxy group, trichloromethoxy group, trifluoromethoxy group, and so forth. However, an alkoxy group having carbon atoms of eight and above is preferable. A polymer or oligomer thereof may be used.

Examples of a substituted or non-substituted cycloalkyl group are a cyclopentyl group, cyclohexyl group, norbomane group, adamantane group, 4-methylcyclohexyl group, 4-cyanocyclohexyl group and so forth. However, a cycloalkyl group having carbon atoms of eight and above is preferable. A polymer or oligomer thereof may be used.

Examples of a substituted or non-substituted heterocyclic group are a pyrrole group, pyrrolyl group, pyrazole group, pyrazoline group, imidazole group, triazole group, pyridine group, pyridazine group, pyrimidine group, pyrazine group, triazine group, indole group, benzimidazole group, purine group, quinoline group, isoquinoline group, cynoline group, quinoxaline group, benzoquinoline group, fluorenone group, dicyano fluorenone group, carbazole group, oxazole group, oxadiazole group, thoazole group, thiadiazole group, benzoxazole group, benzothiazole group, benzotriazole group, bisbenzoxazole group, bisbenzothiazole group, bisbenzimidazole group, and so froth. A polymer or oligomer thereof may be used.

Examples of a substituted or non-substituted acyl group are formyl group, acetyl group, propionyl group, butyryl group, isobytyryl group, valeryl group, isovaleryl group, pivaloyl group, lauroyl group, myristoyl group, palmitoyl group, stearoyl group, oxalyl group, malonyl group, succinyl group, glutaryl group, adipoyl group, pimeloyl group, suberoyl group, azelaoyl group, sebacoyl group, acryloyl group, propioloyl group, methacryloyl group, crotononyl group, isocrotonyl group, oleoyl group, elaidoyl group, maleoyl group, fumaroyl group, citraconoyl group, mesaconoyl group, campholoyl group, benzoyl group, phthaloyl group, isophthaloyl group, terephthaloyl group, naphthoyl group, toluoyl group, hydratropoyl group, atropoyl group, cinnamoyl group, furoyl group, thenoyl group, nicotinoyl group, isonicotinoyl group, glycoloyl group, lactoyl group, glyceroyl group, tartronoyl group, maloyl group, tartaloyl group, troponyl group, benziloyl group, salicyloyl group, anisoyl group, vanilloyl group, veratroyl group, piperonyloyl group, protocatechuoyl group, galloyl group, glyoxyloyl group, pyruvoyl group, acetoacetyl group, meso-oxalyl group, meso-oxal group, oxalacetyl group, oxalaceto group, levulinoyl group, and so froth. These acyl groups may be substituted with fluorine, chlorine, bromine or iodine. An acyl group having carbon atoms of eight and above is preferable. A polymer or oligomer thereof may be used.

Specific examples of the acyl group are formyl group, acetyl group, propionyl group, isobytyryl group, valeryl group, isovaleryl group, pivaloyl group, lauroyl group, myristoyl group, palmitoyl group, stearoyl group, oxalyl group, malonyl group, succinyl group, glutaryl group, adipoyl group, pimeloyl group, suberoyl group, azelaoyl group, sebacoyl group, acryloyl group, propioloyl group, methacryloyl group, crotononyl group, isocrotonyl group, oleoyl group, elaidoyl group, maleoyl group, fumaroyl group, citraconoyl group, mesaconoyl group, campholoyl group, benzoyl group, phthaloyl group, isophthaloyl group, terephthaloyl group, naphthoyl group, toluoyl group, hydratropoyl group, atropoyl group, cinnamoyl group, furoyl group, thenoyl group, nicotinoyl group, isonicotinoyl group, glycoloyl group, lactoyl group, glyceroyl group, tartronoyl group, maloyl group, tartaloyl group, troponyl group, benziloyl group, salicyloyl group, anisoyl group, vanilloyl group, veratroyl group, piperonyloyl group, protocatechuoyl group, galloyl group, glyoxyloyl group, pyruvoyl group, acetoacetyl group, meso-oxalyl group, meso-oxal group, oxalacetyl group, oxalaceto group, levulinoyl group, and so froth. These acyl groups may be substituted with fluorine, chlorine, bromine or iodine.

The present invention will be more clearly understood with reference to the following examples:

EXAMPLE 1

Compounds relevant to Example 1 are shown in chemical structural formulae (5) and (6);

Formula (5)

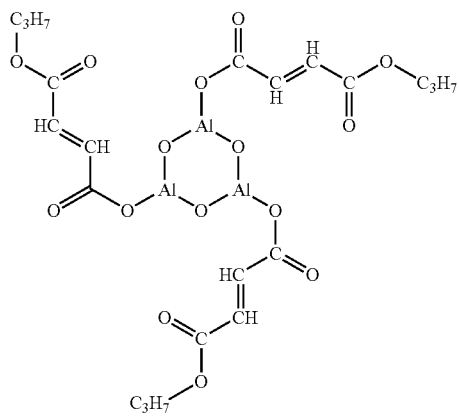

(Formula (6))

The compound illustrated by chemical structural formulae (5) was synthesized in such a manner as described below:

16 g of water and 60 g of isopropanol were poured into a distillation flask and evaporated, and then heated up to 120° C. 204 g of aluminum isopropoxide and 60 g of isopropanol were poured into a flask heated at 80° C. and agitated vigorously, then the water and isopropanol which were evaporated were added slowly to obtain reaction solution. The reaction solution gradually became slurry. The reaction solution was further heated to 200° C. to remove isopropanol and form a dry and white powder comprising 100 g of cyclic isopropoxy aluminum oxide trimer.

The compound illustrated by the chemical structural formula (7) was synthesized by the use of the compound illustrated by the chemical structural formula (5) in such a manner as described below. In this synthesis, a double bond between C and C was formed.

Formula (7)

200 g of toluene were weighed into a three neck distillation flask. The reaction was carried out in the stream of nitrogen. Next, 3.06 g of cyclic isopropoxy aluminum oxide trimer obtained in the preceding step were weighed into the flask. And then, 2.94 g of maleic anhydride were weighed in to the flask to form a solution. The solution was agitated vigorously for two hours at room temperature. Next, solvent, toluene, was removed by an evaporator to obtain. 3 g of product.

Processes (1-a) and (1-b) for forming a water-capturing agent by the use of the above-described product are described below:

Process (1-a)

By the use of the above-described product, a photosensitive resin was prepared in such a manner as describe below:

1.9 g of 2-hydorxymethacrylate (HEMA) were poured into a reaction container with a stirrer. 3 g of the product obtained were then added into the reaction container and stirred, and then 1 g of polyethylene glycol was added into the reaction container. Then, 0.03 g of "DETX_S"® commercially available from NIHON KAYAKU, Ltd. and 0.03 g of tirethanolamine were added as an initiator into the reaction container and agitated to form a solution. This work was carried out in the stream of nitrogen. The solution was agitated sufficiently until it became homogeneous. The solution thus obtained was poured into a dispenser.

Next, procedures for using the photosensitive resin thus obtained in an organic El device are described by the use of an organic EL device shown in FIG. 1 as an example of the organic EL device used.

The organic EL device 1 is a sealed container comprising the glass substrate 2 of a rectangle-shaped glass plate and the glass-made sealing cap 3 placed opposite the glass substrate, which are sealed with the adhesive 8 of the sealing portion. The anode 5 is a 200 nm thick conductive, transparent ITO film formed by a sputtering process on the entire upper surface of the glass substrate 2, and is one of the components of the sealed container. Then, the anode 5 was completed by patterning in a desired shape by means of a photolithography process. A part of the anode 5 was pulled to the end of the glass substrate 2 and connected to a driven circuit (not shown) as a lead electrode.

After the glass substrate with the ITO film was cleaned and dried, it was placed in a vacuum evaporation apparatus. After the vacuum evaporation apparatus was evacuated to a vacuum of $10^{-6}$ torr, a 20 nm thick film of copper phthalocyanine (CuPc) was evaporated over the entire upper surface of the anode 5 as the hole-injecting layer 4a. Then, a 30 nm thick film of bis(N-(1-naphtyl-n-phenyl)benzidine(αNPD) was laminated over the entire upper surface of the hole-injecting layer 4a as the hole-transporting layer 4b. Next, a 50 nm thick film of tris (8-quinolylat) aluminum ($Alq_3$) was laminated over the entire upper surface of the hole-transporting layer 4b as the light-emitting-and-electron-transporting layer 4c. Further, a 20 nm thick film of Al—Li alloy was laminated by a co-evaporation process over the entire upper surface of the light-emitting-and-electron-transporting layer 4c to form an upper electrode (cathode). A part of the cathode was pulled to the end of the glass substrate 2 and connected to a driven circuit (not shown) as a lead electrode.

Next, the vacuum system was released and a sealing process was carried out in an atmosphere of dried nitrogen. In the atmosphere of dried nitrogen, the photosensitive resin was applied by a dispenser to a glass substrate which was subjected to a spot facing processing to form a film. Next, the film of the photosensitive resin was irradiated with ultraviolet light at an exposure of 100 mW/cm² to cure the photosensitive resin. Thereafter, an organic El device was heated up to 100° C. in an oven to adsorb the moisture in the device.

After the state of the light emission of the organic EL device was observed by a microscope, it was put in an atmosphere of high temperature and high humidity of 85° C. and 85% to confirm the water-capturing effect. After an elapse of 100 hours, the device was taken out and the state of the light emission of the device was observed by a microscope. As a result, the growth of non-light emitting portions (darkspot) was not observed, and it was confirmed that such a photosensitive resin of the present invention functions sufficiently as a water-capturing agent.

Process (1-b)

Next, a thermosetting resin was prepared by the use of the product obtained in such a manner as described below:

3 g of the product obtained and 1.97 g of 2-hydoxymethacrylate (HEMA) were poured in a reaction container with a stirrer and stirred, then 1 g of polyethylene glycol dimethacrylate and 0.03 g of "PEROCTAO"®, commercially available from NIHON OIL AND FATTS, Ltd. as a thermal polymerization initiator, were added into the reaction container and agitated to form a solution. Agitation was carried out in a stream of nitrogen. The solution was agitated sufficiently until it became homogeneous.

Next, procedures for using the thermosetting resin thus obtained in an organic El device are described with reference to an organic EL device shown in FIG. 1 as an example of organic EL device used.

The organic EL device 1 is a sealed container comprising the glass substrate 2 of a rectangle-shaped glass plate and the glass-made sealing cap 3 placed opposite the glass substrate, which are sealed with the adhesive 8 of the sealing portion. The 200 nm thick conductive, transparent anode 5 was formed by a sputtering process on the entire upper surface of the glass substrate 2 which is one of the components of the sealed container. Then, the anode 5 was completed by patterning in a desired shape by means of a photolithography process. A part of the anode 5 was pulled to the end of the glass substrate 2 and connected to a driven circuit (not shown) as a lead electrode.

After the glass substrate with the ITO film was cleaned and dried, it was placed in a vacuum evaporation apparatus. After the vacuum evaporation apparatus was evacuated to a vacuum of $10^{-6}$ torr, a 20 nm thick film of copper phthalocyanine (CuPc) was evaporated over the entire upper surface of the anode 5 as the hole-injecting layer 4a. Then, a 30 nm thick film of bis(N-(1-naphtyl-n-phenyl) benzidine($\alpha$-NPD) was laminated over the entire upper surface of the hole-injecting layer 4a as the hole-transporting layer 4b. Next, a 50 nm thick film of tris (8-quinolylat) aluminum ($Alq_3$) was laminated over the entire upper surface of the hole-transporting layer 4b as the light-emitting-and-electron-transporting layer 4c. Further, a 200 nm thick film of Al—Li alloy was laminated by a co-evaporation process over the entire upper surface of the light-emitting-and-electron-transporting layer 4c as an upper electrode (cathode). A part of the cathode was pulled to the end of the glass substrate 2 and connected to a driven circuit (not shown) as a lead electrode.

Next, the vacuum system was released and a sealing process was carried out in an atmosphere of dried nitrogen. In the atmosphere of dried nitrogen, the thermosetting resin obtained was applied by a dispenser to a glass substrate which was subjected to a spot facing processing to form a film. Next, the film of the thermosetting resin was placed on a hot plate and heated at 90° C. for 10 minutes to cure. An ultraviolet-curing epoxy resin adhesive was applied to the peripheral portions of the sealing glass, laminated with the substrate of the device, and irradiated with ultraviolet light to cure. Thereafter, the device was heated up to 100° C. in an oven to adsorb the moisture in the device.

After the state of the light emission of the organic EL device was observed by a microscope, it was put in an atmosphere of high temperature and high humidity of 85° C. and 85% to confirm the water-capturing effect. After an elapse of 100 hours, the device was taken out and the state of the light emission of the device was observed by a microscope. As a result, the growth of non-light emitting portions (darkspot) was not observed, and it was confirmed that such a thermosetting resin of the present invention functions sufficiently as a water-capturing agent.

As shown in FIG. 1, the sealing cap 3 of the organic EL device 1 is a flat plate of a glass plate, but not restricted thereto. Such a structure as a container-shaped sealing cap may be adopted, in which a sealing portion of the outer periphery of the sealing cap projects outwardly and the space for forming water-capturing means is concave. The water-capturing agent using these compounds of the present invention is applied to a glass substrate. However, an alternative method of use may be adopted. The water-capturing agent using these compounds of the present invention is dissolved in a solvent harmless to an organic EL device to form a liquid water-capturing agent. The liquid water-capturing agent thus formed is then charged into the organic El device to which the sealing cap is not yet fixed. Thereafter, the organic El device is sealed. Since the water-capturing agent of the present invention is transparent, it is not necessary to restrict the place in which the water-capturing agent is sealed.

In the drying process of the organometallic complex compound of example 1 described above, solvent used is removed under reduced pressure and the compound is dried usually at about 180° C. at a final step in the manufacturing process. The drying process may be carried out at a drying temperature of 200° C. and above. During the drying process, the organometallic complex compounds may undergo a dehydration reaction which results in linking the plural organometallic complex compounds to each other by the dehydration reaction of the substituents in each of the organometallic complex compounds. Even in such a case, the water-capturing power does not decrease compared with the compounds described above and the water-capturing power equivalent, or superior, to those of the compounds described above can be expected. When a mixture of different types of compounds described in the above example 1 or a mixture of the compound described in the above example 1 with another compound is used, the water-capturing effects equivalent, or superior, to those obtained by using singly a compound described in the above example 1 can be obtained by synergistic effects.

By combining the compound described in the above-described example with a substituent having a cyclic structure to which many ligands are linked, the compound itself captures moisture and simultaneously the hydrophobic effect of the compound can be increased by virtue of the substituent.

Since the organometallic complex compound described in example 1 is harmless to a human body, the workability in manufacturing an organic El device can be improved. The organometallic complex compound described in example 1 can be used not only for an organic El device, but also for several types of electronic devices which have a sealed structure and are adversely affected by moisture, such as a plasma display, solar battery, electronic paper, and so forth.

The photopolymerization initiator described above is not restricted to that used in the above example, but several types of photopolymerization initiators known as a photopolymerization initiator for vinyl monomer can be used. Examples of such a photopolymerization initiator are an acetophenone-type, benzoic ether-type, benzophenone-type, thioxanthone-type, amine-type, etc. Specific examples are "Irgacure907"® (2-metyl1 [4-(metylthio) phenyl]-2-morpholinopropane-1 one), "Irgacure369"® (2-benzyl-2-dimetylamino-1-(4-morpholinophenyl)-butane-1) commercially available from CIBA GEIGY, thioxanthone-type initiator "DETX2"®, (4-ciethylthioxanthone) commercially available from NIHON KAYAKU Co., Ltd.

By using a photopolymerization accelerator in combination with a photopolymerization initiator, the reaction velocity of radical polymerization reaction can be increased. There is no problem when the reaction is carried out in an atmosphere of nitrogen. However, there is a problem when the reaction is carried out in the presence of oxygen, activated oxygen reacts with a radical to terminate the polymerization reaction. When an amine is used as a photopolymerization accelerator, it reacts with activated oxygen to trap the activated oxygen. For example, a tertiary amine such as triethanolamine, bisdiethylbenzophenone, and so forth, may be used as a photopolymerization accelerator.

Further, a monomer or prepolymer may be used as a photosensitive composition. Specific examples of the monomer are acrylic monomers such as ethylene glycol di(meth) acrylate, propylene glycol(meth) acrylate, neopenthyl glycol di(meth) acrylate, polyethylene glycol di(meth) acrylate, polypropylene glycol di(meth) acrylate, trimethylolpropane tri(meth) acrylate, pentaerythritol penta(meth) acrylate, dipentaerythritol hexa(meth) acrylate, trimethylolpropane monobenzoate di(meth) acrylate, di(meth)acrylate of adduct of bisphenol A with ethylene oxide, hydrogenated bisphenol A di(meth) acrylate, di(meth)acrylate of adduct of nonylphenol with ethylene oxide, di(meth)acrylate of adduct of bisphenol A with propylene oxide, trimethylpropane mono-octoate di(meth) acrylate, pentaerythritol mono-octoate tri(meth) acrylate, trimethylolpropane mono-caprylate di(meth) acrylate, pentaerythritol propane mono-caprylate tri(meth) acrylate, trimethylolpropane mono-laurate di(meth) acrylate, pentaerythritol mono-laurate tri(meth) acrylate, and so forth.

A polymerizable prepolymer may be also used. Such a polymerizable prepolymer is epoxy(meth)acrylate which is prepared by esterifying bisphenol A-type epoxy resin with (meth)acrylic acid or, in some instances, long chain fatty acid such as coconut oil fatty acid, and so forth, or modified products of long chain fatty acid may be used. Alternatively, epoxy (meta) acrylate having a carboxyl group which is prepared by adding dibasic acid anhydride, tetrabasic acid di-anhydride or trimellitic acid anhydride to epoxy (meth) acrylate may be used, or its modified products may be also used.

In order to impart printability, thickening properties, leveling properties, adhesive properties on a substrate to a photosensitive composition, addition of polymer (resin) may be adopted. Examples of film-forming resin are alkyd resin, modified alkyd resin, phenolic resin, polyester resin, epoxy resin, xylene resin, ketone resin, acrylic resin, polystyrene resin, polyamide resin, polycarbonate resin, polyester resin, polyether resin, petroleum resin, rosin-modified maleic acid resin, maleic acid resin, gulonic acid resin, phenoxy resin, cellulosic resin, and so forth. Examples of the above-described modified alkyd resin are oil-modified alkyd resin, rosin-modified alkyd resin, maleinized rosin-modified alkyd resin, rosin alcohol-modified alkyd resin, phenolic resin-modified alkyd resin, epoxy resin-modified alkyd resin, amino resin-modified alkyd resin, silicone resin-modified alkyd resin, styrene-modified alkyd resin, vinyltoluene-modified alkyd resin, polyamide resin-modified alkyd resin, polyimide resin-modified alkyd resin, urethane-modified alkyd resin, and so forth.

Examples of organometallic complex compound to be reacted with the modified alkyd resin described above are metal alcoholates which are formed by substituting a hydrogen atom of hydroxyl group of alcohols with a metallic element such as Be, Mg, Ca, Sr, Ba, Zn, Cd, Sc, Al, Ti, Zr, V, Cr, Mn, Fe, Co, Ni, Cu, Ce, and so forth. Further, the organometallic complex compound to be reacted with the modified alkyd resin also includes an inner complex compound which has such a metallic element as a central atom and has β-diketone-type compound or β-keto-ester-type compound as a ligand and includes an inner complex compound which has an alkoxylated metallic element as a central atom and has β-diketone-type compound or β-keto-ester-type compound as a ligand.

Examples of alkoxyl group of the metal alcoholate or inner complex compound are methoxy group, ethoxy group, propoxy group, butoxy group, and so forth. Examples of β-diketone-type compound as a ligand are acetylacetone, trifluoroacetylacetone, benzoylacetone, benzoyltrifluoroacetone, dibenzoylmethane, thenoylacetone, and so forth. Examples of β-keto-ester-type compound, as a ligand, are keto-carboxylic acid ester compounds having a carbonyl group at β-position, such as acetoacetic ester, benzoylacetic acid ester, 2-carboalcoxy cyclohexanone, salicylic acid ester, and so forth, and an enol form compound, an isomer of such keto-carboxylic acid ester compounds.

The modified alkyd resin and the organometallic complex compound are reacted by heating them at temperatures from 90° C.~120° C. for 0.5~2 hours at a ratio of 0.1~10 parts by weight of the latter to 100 parts by weight of the former. It is preferable that resin other than the modified alkyd resin, having a hydroxyl group such as ethyl cellulose, hydroxypropyl cellulose and so forth is pre-reacted with the metal alcoholate described above.

An organic solvent may be used as diluent for adjusting the viscosity. When an organic solvent is used, the solution is applied to a substrate and heated to remove the solvent at a pre-baking step. Thereafter, the photopolymerization or thermal polymerization reaction is carried out. Solvent having good compatibility with a photosensitive resin is preferably selected as a solvent to be used. The boiling point of the solvent is preferably selected according to a coating method. For example, when a spin-coat or spray-coat method is adopted, the solvent having the boiling point of about 100° C. is preferably used. When a screen printing method is adopted, the solvent having the boiling point of about 200° C. is preferably used. It is naturally preferable to use solvent which does not adversely affect the human body. A thermopolymerization inhibitor may be added in order to improve storage stability. For example, hydroquinone or hydroquinone mono-methyl ether may be added as a thermopolymerization inhibitor. In case of thermopolymerization, it is preferable to use a compound generating a radical by heating at about 100° C. instead of a photopolymerization initiator. For example, 3, 3, 4, 4-tetra (tert-butyl-peroxycarbonyl) benzophenone (BTTB) may be used.

2. COMPARATIVE EXAMPLE

2-1: Comparative Example 1

An organic El device was formed having the same structure as those of Examples 1~3, except that a water-capturing means was not mounted.

Since the organic El device was formed in a vacuum reactor, the vacuum system of the reactor was released and a sealing step was carried out in an atmosphere of dried nitrogen. A water-capturing agent was not placed into a sealing cap. An ultraviolet curing-type epoxy resin adhesive was applied to the peripheral portion of the sealing cap and laminated to the substrate of the device, and irradiated with ultraviolet light to cure the epoxy resin.

After the state of the light emission of the organic EL device was observed by a microscope, it was put in an atmosphere of high temperature and high humidity of 85° C. and 85% to confirm the water-capturing effect by an accelerated lifetime test. After an elapse of 100 hours, the device was taken out and the state of the light emission of the device was observed by a microscope. As a result, non-light emitting portions (darkspot) were large and grew 50 μm and above which could be observed visually.

2-2: Comparative Example 2

For a comparative example, a compound having yttrium (Y) as a central metal atom illustrated by the chemical structural formula (8) was synthesized.

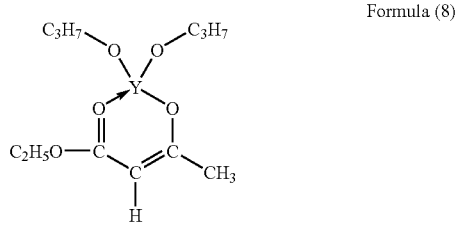

Formula (8)

An organic El device was formed by the use of the compound illustrated by the chemical structural formula (8) as a water-capturing agent, having the same structure as that of Example 1, except that a water-capturing agent was different.

Since the organic El device was formed in a vacuum reactor, the vacuum system of the reactor was released and a sealing step was carried out in an atmosphere of dried nitrogen. A 50% toluene solution of the compound illustrated by the chemical structural formula (8) was applied to the inner surface of the sealing glass and dried. After it was dried, an ultraviolet curing-type epoxy resin adhesive was applied to the peripheral portion of the sealing glass and laminated to the substrate of the device, and irradiated with ultraviolet light to cure the epoxy resin.

After the state of the light emission of the organic EL device was observed by a microscope, it was put in an atmosphere of high temperature and high humidity of 85° C. and 85% to confirm the water-capturing effect by an accelerated lifetime test. After an elapse of 100 hours, the device was taken out and the state of the light emission of the device was observed by a microscope. As a result, it was proved that non-light emitting portions (darkspot) grew about 25 μm and that the water-capturing ability and effect of the water-capturing agent of the present invention are higher than those of the compound illustrated by the chemical structural formula (8), though it functions as a water-capturing agent.

EFFECT OF THE PRESENT INVENTION

According to the present invention, effects illustrated below can be obtained:

Since the water-capturing agent contains an organic compound having a double bond, time required for treatment can be shortened, compared with a heat-dried type water-capturing agent of a prior art.

Since an apparatus can be minimized, a space for an apparatus is small and operating efficiency can be improved.

Since the water-capturing agent is transparent, it can be used not only for an organic EL device, but also for various types of applications. Thereby, great effect can be obtained in industry.

By combination of the water-capturing agent with an ultraviolet-curing type adhesive, a drying process can be performed for a short time, compared with a water-capturing agent of a prior art.

Facilities and working processes required for drying can be kept to a minimum and hence initial cost and running cost can be kept to a minimum.

The water-capturing agent of the present invention has a double bond, and hence the water-capturing ability can be improved, compared with a conventional water-capturing agent and the growth of a darkspot can be effectively suppressed. The water-capturing agent of the present invention, therefore, can improve significantly the storage lifetime and driving lifetime.

What is claimed is:

1. A water-capturing agent comprising a compound illustrated by the chemical structural formula (1);

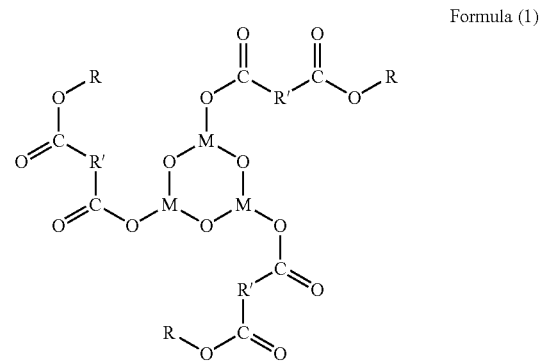

Formula (1)

wherein R are independently a substituent selected from the group consisting of a substituted or non-substituted alkyl group, a substituted or non-substituted alkenyl group, a substituted or non-substituted aryl group, a substituted or non-substituted cycloalkyl group, a substituted or non-substituted alkoxy group, a substituted or non-substituted acyl group and a substituted or non-substituted heterocyclic group having an unsaturated bond and one or more of a hydrogen atom and a carbon atom, and wherein M is a metal, and wherein R' are independently a substituent selected from the group consisting of a substituted or non-substituted alkylene group, a substituted or non-substituted alkylidene group, a substituted or non-substituted alkenylene group, a substituted or non-substituted alkenylidene group, a substituted or non-substituted arylene group, a substituted or non-substituted cycloalkylene group, a substituted or non-substituted cycloalkylidene group, a substituted or non-substituted oxyalkylene group, a substituted or non-substituted divalent radical derived from an acyl group and a divalent radical derived from a substituted or non-substituted heterocyclic group having an unsaturated bond and one or more of a hydrogen atom and a carbon atom.

2. A water-capturing agent as in claim 1, wherein said substituent R of the compound illustrated by the chemical structural formula (1) is two or more different groups.

3. A water-capturing agent as in claim 1, wherein said substituent R of the compound illustrated by the chemical structural formula (1) is two different groups.

4. A water-capturing agent as in claim 1, wherein said substituent R of the compound illustrated by the chemical structural formula (1) is three different groups.

5. A water-capturing agent as in claim 1, wherein said compound is chemically bonded with another compound.

6. A water-capturing agent as in claim 1, further comprising a photosensitizer for permitting said water-capturing agent to dry under a drying process with ultraviolet-light irradiation.

7. A water-capturing agent as in claim 1, further comprising a thermopolymerizable material for permitting said water-capturing agent to dry under a drying process by heating.

8. An organic EL device comprising:
an organic EL light-emitting portion having a hole-injecting layer, a hole-transporting layer and a light-emitting layer formed of an organic compound laminated between a pair of electrodes at least one of which is transparent;
a sealed container for sealing the organic EL light-emitting portion; and
a water-capturing agent placed in the sealed container, wherein said water-capturing agent is represented by the chemical structural formula (1).

Formula (1)

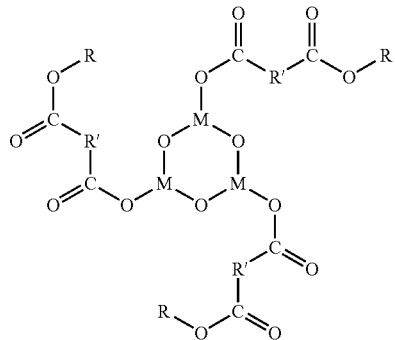

wherein R are independently a substituent selected from the group consisting of a substituted or non-substituted alkyl group, a substituted or non-substituted alkenyl group, a substituted or non-substituted aryl group, a substituted or non-substituted cycloalkyl group, a substituted or non-substituted alkoxy group, a substituted or non-substituted acyl group and a substituted or non-substituted heterocyclic group having an unsaturated bond and one or more of a hydrogen atom and a carbon atom, and wherein M is a metal, and wherein R' are independently a substituent selected from the group consisting of a substituted or non-substituted alkylene group, a substituted or non-substituted alkylidene group, a substituted or non-substituted alkenylene group, a substituted or non-substituted alkenylidene group, a substituted or non-substituted arylene group, a substituted or non-substituted cycloalkylene group, a substituted or non-substituted cycloalkylidene group, a substituted or non-substituted oxyalkylene group, a substituted or non-substituted divalent radical derived from an acyl group and a divalent radical derived from a substituted or non-substituted heterocyclic group having an unsaturated bond and one or more of a hydrogen atom and a carbon atom.

9. The organic EL device as in claim 8, wherein said substituent R of the compound illustrated by the chemical structural formula (1) is two or more different groups.

10. The organic EL device as in claim 8, wherein said substituent R of the compound illustrated by the chemical structural formula (1) is two different groups.

11. The organic EL device as in claim 8, wherein said substituent R of the compound illustrated by the chemical structural formula (1) is three different groups.

12. The organic EL device as in claim 8, wherein said compound is chemically bonded with another compound.

13. The organic EL device as in claim 8, further comprising a photosensitizer for permitting said water-capturing agent to dry under a drying process with ultraviolet-light irradiation.

14. The organic EL device as in claim 8, further comprising a thermopolymerizable material for permitting said water-capturing agent to dry under a drying process by heating.

* * * * *

UNITED STATES PATENT AND TRADEMARK OFFICE
CERTIFICATE OF CORRECTION

PATENT NO. : 7,030,258 B2 Page 1 of 1
APPLICATION NO. : 10/868019
DATED : April 18, 2006
INVENTOR(S) : Takahashi et al.

It is certified that error appears in the above-identified patent and that said Letters Patent is hereby corrected as shown below:

Column 6, line 28, "infiared" should be -- infrared --.

Column 7, line 56/57, "norbomane" should be -- norbornane --.

Column 9, line 64, "hydorxymethacrylate" should be -- hydroxymethacrylate --.

Column 10, line 66/67, "hydoxymethacrylate" should be -- hydroxymethacrylate --.

Column 12, line 7, "harnless" should be -- harmless --.

Signed and Sealed this

Fifteenth Day of August, 2006

JON W. DUDAS
*Director of the United States Patent and Trademark Office*